United States Patent
Liu et al.

(10) Patent No.: US 7,932,301 B2
(45) Date of Patent: Apr. 26, 2011

(54) ENCAPSULANT COMPOSITION AND METHOD FOR FABRICATING ENCAPSULANT MATERIAL

(75) Inventors: Lung-Chang Liu, Xinzhuang (TW); Ming-Hua Chung, Tainan (TW); Jen-Hao Chen, Hsinchu (TW)

(73) Assignee: Industrial Technology Research Institute (TW)

(*) Notice: Subject to any disclaimer, the term of this patent is extended or adjusted under 35 U.S.C. 154(b) by 165 days.

(21) Appl. No.: 12/193,499

(22) Filed: Aug. 18, 2008

(65) Prior Publication Data
US 2009/0270526 A1    Oct. 29, 2009

(30) Foreign Application Priority Data
Apr. 25, 2008    (TW) ............... 97115208 A

(51) Int. Cl.
C03F 7/029 (2006.01)
B29C 71/04 (2006.01)
C03C 25/10 (2006.01)
C08F 20/22 (2006.01)

(52) U.S. Cl. ............. 522/66; 522/71; 522/83; 522/170; 522/172; 522/182

(58) Field of Classification Search .................. 522/66, 522/71, 83, 170, 172, 182
See application file for complete search history.

(56) References Cited

U.S. PATENT DOCUMENTS

| 4,328,325 | A  | * | 5/1982  | Marquardt et al. ........... 525/451 |
| 5,340,420 | A  |   | 8/1994  | Ozimek et al. |
| 6,099,783 | A  |   | 8/2000  | Scranton et al. |
| 6,129,955 | A  |   | 10/2000 | Papathomas et al. |
| 6,133,522 | A  |   | 10/2000 | Kataoka et al. |
| 7,205,718 | B2 |   | 4/2007  | Cok |
| 7,261,795 | B2 |   | 8/2007  | Wilkinson et al. |
| 2003/0114556 | A1 |   | 6/2003  | Jennrich et al. |
| 2004/0187999 | A1 |   | 9/2004  | Wilkinson et al. |
| 2005/0158480 | A1 | * | 7/2005  | Goodwin et al. ............. 427/569 |
| 2006/0135705 | A1 |   | 6/2006  | Vallance et al. |
| 2006/0223978 | A1 |   | 10/2006 | Kong |
| 2007/0049655 | A1 | * | 3/2007  | Yoshimune et al. .......... 522/178 |
| 2007/0178629 | A1 |   | 8/2007  | Ogawa et al. |
| 2007/0190693 | A1 |   | 8/2007  | Lee et al. |

FOREIGN PATENT DOCUMENTS

| EP | 0 969 058 | | 1/2000 |
| EP | 1502922 A1 | * | 2/2005 |
| EP | 1 911 579 | | 4/2008 |
| JP | 2000-061974 | | 2/2000 |
| JP | 2005187799 | | 7/2005 |
| WO | WO 2007/120197 | | 10/2007 |

* cited by examiner

*Primary Examiner* — Mark Eashoo
*Assistant Examiner* — Jessica Paul
(74) *Attorney, Agent, or Firm* — Lowe Hauptman Ham & Berner, LLP

(57) ABSTRACT

An encapsulant composition is provided, including at least one resin monomer, a filler and a photoinitiator, wherein the at least one resin monomer is selected from the group consisting of acrylic resin monomer, epoxy resin monomer, silicone resin monomer and compositions thereof, and the filler is of about 0.1~15 weight % of the encapsulant composition. A method for forming encapsulant materials is also provided.

15 Claims, 2 Drawing Sheets

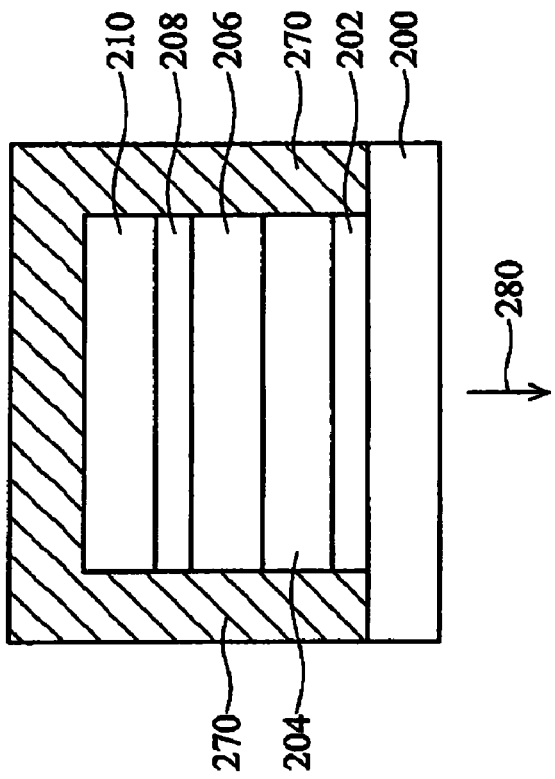
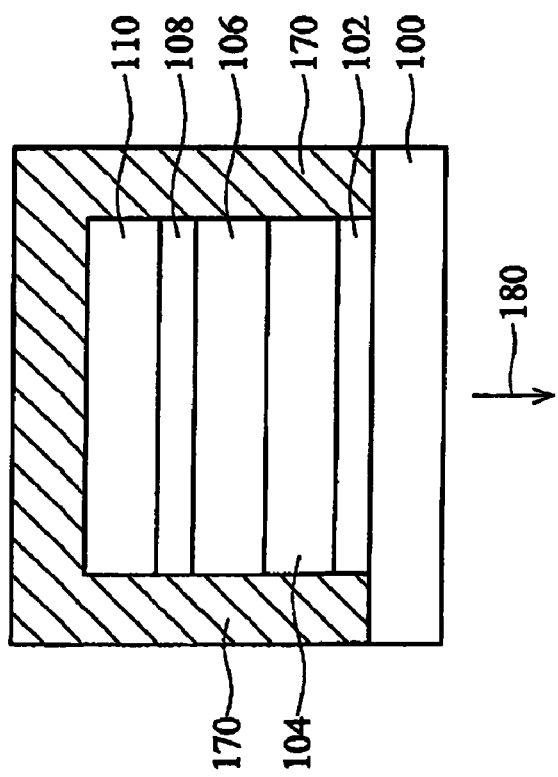

ENCAPSULANT COMPOSITION AND METHOD FOR FABRICATING ENCAPSULANT MATERIAL

CROSS REFERENCE TO RELATED APPLICATIONS

This Application claims priority of Taiwan Patent Application No. 097115208, filed on Apr. 25, 2008, the entirety of which is incorporated by reference herein.

BACKGROUND OF THE INVENTION

1. Field of the Invention

The invention relates to encapsulant compositions, and in particular relates to encapsulant compositions for fabricating encapsulant materials of high light-transmittance and methods for forming encapsulant materials capable of packaging solid state light-emitting elements, thereby improving light transmittance thereof.

2. Description of the Related Art

Optical-electronic devices such as organic light emitting diodes (OLED), light emitting diodes (LED) and solar cells have been developed due to developments in the optical-electronic industry. Optical-electronic elements in the optical-electronic devices, however, are easily affected by moisture and oxygen in the ambient and thus decrease operating lifespan thereof. Therefore, the optical-electronic devices are usually packaged by suitable materials to block the optical-electronic elements therein from the moisture and oxygen in the ambient, thereby increasing operating lifespan thereof.

Conventional encapsulant materials are synthesized by thermal processes. A resin monomer is first synthesized to form a resin, and fillers and hardeners are then added and mixed therewith to obtain an encapsulant material. The above thermal processes are time-consuming, normally taking couple of hours or up to ten hours or more for completing resin synthesis. In addition, since the above thermal processes incorporate solvents, reaction conditions and process safety issues are a concern. Therefore, fabrication time and costs for fabricating encapsulant materials by the thermal processes are not easily reduced.

Thus, a novel method for fabricating encapsulant materials and encapsulant compositions for forming thereof are needed to fabricate encapsulant materials in a faster and safer method, decrease fabrication time and costs, and improve safety issues during fabrication.

BRIEF SUMMARY OF THE INVENTION

Accordingly, encapsulant compositions and methods for fabricating encapsulant materials having lower production costs, decreased fabrication safety issues and faster fabrication processes are provided.

An exemplary encapsulant composition comprises at least one resin monomer, a filler and a photoinitiator, wherein the at least one resin monomer is selected from the group consisting of acrylic resin monomer, epoxy resin monomer, silicone resin monomer and compositions thereof, and the filler is of about 0.1~15 weight % of the encapsulant composition.

An exemplary method for forming encapsulant materials comprises providing an encapsulant composition and performing a first illumination process by a light source to illuminate and polymerize the encapsulant composition, thereby forming the encapsulant materials, wherein the encapsulant composition comprises at least one resin monomer, a filler and a photoinitiator. Additionally, at least one resin monomer is selected from the group consisting of acrylic resin monomer, epoxy resin monomer, silicone resin monomer and compositions thereof, and the filler of about 0.1~15 weight % of the encapsulant composition.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 1 is a schematic diagram showing an organic light emitting diode according to an embodiment of the invention;

FIG. 2 is a schematic diagram showing a flexible light emitting diode according to an embodiment of the invention;

DETAILED DESCRIPTION OF THE INVENTION

Figure 4:
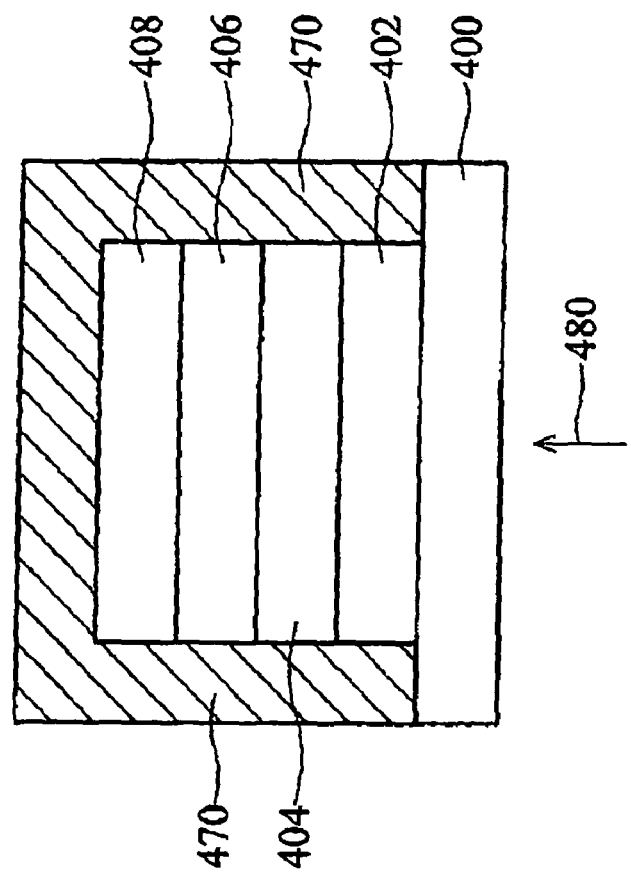
FIG. 4 is a schematic diagram showing an organic solar cell device according to an embodiment of the invention.

The following description is of the best-contemplated mode of carrying out the invention. This description is made for the purpose of illustrating the general principles of the invention and should not be taken in a limiting sense. The scope of the invention is best determined by reference to the appended claims.

The encapsulant composition and the method for fabricating encapsulant materials of the invention have the advantages of having lower production costs, improved fabrication safety issues, and much faster fabrication processes than that provided by the prior art using thermal processes. The encapsulant materials of the invention also show high moisture resistance and gas blocking ability, thereby making it appropriate for application when forming packages of light emitting elements, such as light emitting diodes (LED).

The encapsulant composition of the invention mainly includes resin monomers, filler and photoinitiator. Ration of the materials in the encapsulant composition can be adjusted to form transparent packaging materials having high light transparency. In the encapsulant composition of the invention, the resin monomer is about 100 parts by weight, and the filler and the photoinitiator respectively is about 0.1~15 parts by weight and 0.1~1 part by weight base on the 100 parts by weight of the resin monomers. The filler is about 0.1~15 weight % of the encapsulant composition and is preferably of about 5~15 weight % of the encapsulant composition.

In one embodiment, the encapsulant composition of the invention comprises at least one resin monomer, such as an acrylic resin monomer, an epoxy resin monomer, a silicone resin monomer and compositions thereof.

In another embodiment, the acrylic resin monomer may comprise a structure represented by a formula of:

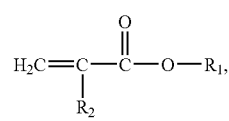

wherein each of the $R_1$ and $R_2$ is an alkyl group having 1 to 12 carbon atoms, a tert-butyl group, an ester group having 1 to 12 carbon atoms, an alkanol group having 1 to 12 carbon atoms, or a cyclo-alkoxy group having 1 to 12 carbon atoms.

In one embodiment, the epoxy resin monomer may comprise a structure represented by a formula of:

wherein $R_1$ is an alkyl group having 1 to 12 carbon atoms, a tert-butyl group, an ester group having 1 to 12 carbon atoms, an alkanol group having 1 to 12 carbon atoms, or a cyclo-alkoxy group having 1 to 12 carbon atoms.

In one embodiment, the silicone resin monomer may comprise a structure represented a following formula of:

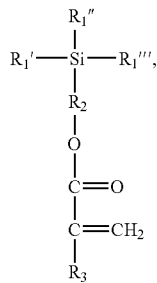

wherein the $R_1'$, $R_1''$ and $R_1'''$ is the same or different, and each of the $R_1'$, $R_1''$, $R_1'''$, $R_2$ and $R_3$ is an alkyl group having 1 to 12 carbon atoms, a tert-butyl group, an ester group having 1 to 12 carbon atoms, an alkanol group having 1 to 12 carbon atoms, or a cyclo-alkoxy group having 1 to 12 carbon atoms.

In one embodiment, the filler may comprise metal oxide such as silicon oxide or silicon aluminum, metal halides such as zinc chloride, or metal nitride such as aluminum nitride or other powders such as calcium carbonate.

In one embodiment, the photoinitiator may comprise free radical initiators such as 1-Hydroxy-cyclohexyl-phenyl-ketone, cationic photoinitiators such as ((Iodonium) 4-methylphenyl) and 4-(2-methylpropyl)phenyl]-hexafluorophosphate, or metallocenes such as Bis(eta5-2,4-cyclopentadien-1-yl)Bis[2,6-difluoro-3-(1H-pyrrol-1-yl)phenyl]titanium.

In one embodiment, the encapsulant composition mainly comprises a plurality of acrylic monomers such as benzyl methacrylate (BZMA), methyl methacrylate (MAA), and 2-hydroxyl ethyl mathacrylate (2-HEMA), and a filler, such as silicon dioxide, and a photoinitiator such as I-184, thereby forming an acrylic polymer. In this embodiment, the acrylic monomer in the acrylic monomer is about 89 weight by parts, and the filler and the photoinitiator respectively is 8~10 weight by part and 1~3 weight by part base on the 100 weight by part of the acrylic monomer. The filler is about 1~40 weight % of the encapsulant composition and preferably about 10~20 weight %. thereof In another embodiment, the encapsulant composition mainly comprises a polyurethane (PU)-acrylics comonomer, a filler such as silicon dioxide, and photoinitiators such as I-184 and I-369, thereby forming a PU-acrylic copolymer. In the encapsulant composition of this embodiment, the PU-acrylic comonomers is about 72 weight by parts, and the filler and the photoinitiator respectively is 20~25 weight by part and 2~5 weight by part base on the 100 weight by part of the PU-acrylic comonomer. The filler is about 1~40 weight % of the encapsulant composition and preferably about 10~20 weight %.

In yet another embodiment, the encapsulant composition mainly comprises a silicone-Acrylics comonomer, a filler such as silicon dioxide, and photoinitiators such as I-184, I-369 and I-ITX, thereby forming a silicone-acrylic copolymer. In the encapsulant composition of this embodiment, the silicone-acrylic monomers is about 71 weight by parts, and the filler and the photoinitiator respectively is about 20~25 weight by part and 2~5 weight by part base on the 100 weight by part of the silicone-acrylic comonomer. The filler is about 1~40 weight % of the encapsulant composition and is preferably about 10~20 weight %.

In another embodiment, the encapsulant composition mainly comprises an epoxy monomer, a filler such as silicon dioxide, and a photoinitiator such as TSHGA, thereby forming an epoxy polymer. In the encapsulant composition of this embodiment, the epoxy monomer is about 90 weight by parts, and the filler and the photoinitiator respectively is 5~9 weight by part and 1~5 weight by part base on the 100 weight by part of the epoxy monomers. The filler is about 1~30 weight % of the encapsulant composition and preferably about 5~15 weight %.

The encapsulant composition can be mixed and illuminated by a light source such as an ultraviolet (UV) light source, a visible light source or an infrared (IR) light source to thereby synthesize the encapsulant composition and form an encapsulant material. Illumination time and power of the light source can be properly adjusted so that the encapsulant material has a viscosity of about 1~100000 cps, preferably between 5000~30000 cps, and a light transparency of more than 85%. Thereby, making the encapsulant material capable of packaging a light emitting element application, such as an organic light emitting diode or a light emitting diode, or a solar cell.

The encapsulant composition of the invention provides the following advantages:

1. Light transparency of the encapsulant material can be adjusted by adjusting content of the filler therein, thereby providing a transparent encapsulant material having a light transparency of more than 85%, and sometimes even more than 90%.

2. The encapsulant material of the invention has great adhesive strength of up to 2.1 kg/cm.

3. The encapsulant material of the invention shows better gas and moisture proof abilities than that of the encapsulant material of the prior art using thermal processes.

4. The encapsulant material of the invention is capable of being applied in packaging optical-electronic devices such as light emitting diodes, organic light emitting diodes, and solar cells and is an appropriate packaging industry material.

Moreover, the invention provides a method for fabricating an encapsulant material, including providing an encapsulant composition and performing a first illumination process by a light source to illuminate and polymerize the encapsulant composition, thereby forming the encapsulant material. The encapsulant composition can be the encapsulant composition described in above embodiments and the first illumination process is performed for about 1 to 200 minutes and may be performed under a power of about 1 to 20000 watts.

In addition, since the encapsulant material may still have some flow properties after the first illumination process and can be formed over an optical-electronic device by, for example, spin-coating and thereby act as a final packaging layer, the method for fabricating the encapsulant material of the invention may further comprise a second illumination process performed by the light source to cure the encapsulant composition coated over the optical-electronic device. A second illumination process is performed for a time of about 1 to 20 minutes and under a power of about 1 to 20000 watts.

The light source used in the first and second illumination processes can be, for example an ultraviolet (UV) light source, a visible light source or an infrared (IR) light source and can be decided according to the type of the photoinitiator used therein.

The method for fabricating encapsulant materials of the invention provides the following advantages:

1. There is no requirement to control reaction pressure and temperature during fabrication of the encapsulant material of the invention as all that is required is steady stirring thereof. Thus, fabricating method for forming the encapsulant material of the invention can be simplified.

2. No solvent is required for forming the encapsulant material of the invention, thus improving fabrication safety.

3. The encapsulant material of the invention is synthesized during fabrication thereof and thus fabrication time and costs are reduced.

4. The filler in the encapsulant material of the invention shows great disparity and the moisture and gas proof ability thereof is improved, thereby improving operating lifespan of packaged devices.

5. Light transparency of the encapsulant material can be adjusted by adjusting contents of the filler therein, thereby providing a transparent encapsulant material having a light transparency of more than 90%.

6. The method for fabricating the encapsulant material of the invention is capable of being applied in packaging optical-electronic devices such as light emitting diodes, organic light emitting diodes, and solar cells and is an appropriate packaging industry material.

The encapsulant composition, the method for fabricating the encapsulant materials, and the related measurement results of the exemplary embodiments and comparative embodiments are described in detail as below. Chemical vendors and formulas of the chemicals used in the following exemplary embodiments and comparative embodiments are provided in the following tables, wherein Table 1 shows information of resin monomers applied therein, and Table 2 shows information of the photoinitiators applied therein, and Table 3 shows information of the optical-electronic materials applied therein.

The above monomers and comonomers have a structure represented as follows:

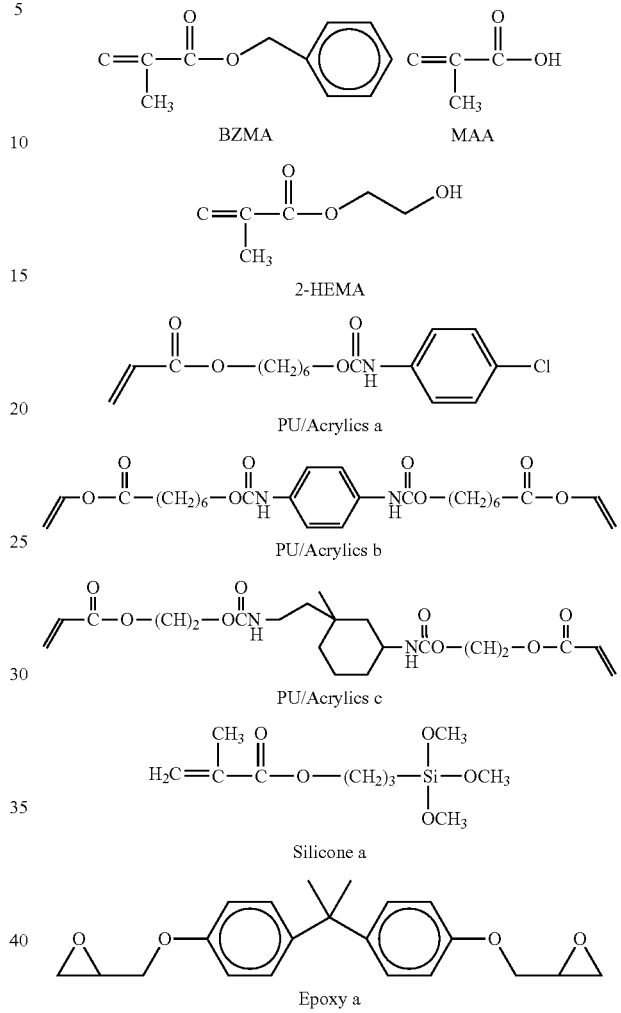

TABLE 1

Applied resin monomers

| Monomer | Source vendor | Descriptions/Remarks |
|---|---|---|
| BZMA | UCB Co. | liquefied monomer; formula: $C_{11}H_{12}O_2$; molecular weight: 176 |
| MAA | UCB Co. | liquefied monomer; formula: $C_4H_6O_2$; molecular weight: 86 |
| 2-HEMA | UCB Co. | liquefied monomer; formula: $C_6H_{10}O_3$; molecular weight: 130 |
| PU/Acrylics comonomer a | UCB Co. | liquefied monomer; formula: $C_{15}H_{12}O_4NCl$; molecular weight: 305.5 |
| PU/Acrylics comonomer b | UCB Co. | liquefied monomer; formula: $C_{25}H_{30}O_8N_2$; molecular weight: 486 |
| PU/Acrylics comonomer c | UCB Co. | liquefied monomer; formula: $C_{28}H_{46}O_8N_2$; molecular weight: 553 |
| Silicone monomer a | Aldrich Co. | liquefied monomer; formula: $C_{10}H_{17}O_5Si$; molecular weight: 245 |
| Epoxy monomer a | UCB Co. | liquefied monomer; formula: $C_{21}H_{24}O_4$; molecular weight: 340 |

TABLE 2

Applied photoinitiators

| Photoinitiator | Source vendor | Descriptions/Remarks |
|---|---|---|
| I-184 (1-hydroxycyclohexyl benzophenone) | Ciba Co. | Suitable for deep UV light source (wavelength between 190 nm~350 nm) |
| I-396 | Ciba Co. | Suitable for deep UV light source |
| I-ITX | Ciba Co. | Suitable for deep UV light source |
| I-127 | Ciba Co. | Suitable for deep UV light source |
| TSHFA | Aldrich Co. | Suitable for deep UV light source |
| D-1173 (alpha-Hydroxyketone) | Ciba Co. | Suitable for UV light source (wavelength between 300 nm~380 nm) |
| D-MBF (Methylbenzoylformate) | Ciba Co. | Suitable for UV light source |
| I-2100 (Phosphine oxide) | Ciba Co. | Suitable for UV light source |
| I-784 (metallocene) | Ciba Co. | Suitable for visible light source (wavelength between 500 nm~700 nm) |

The above photoinitiators have structures represented as follows:

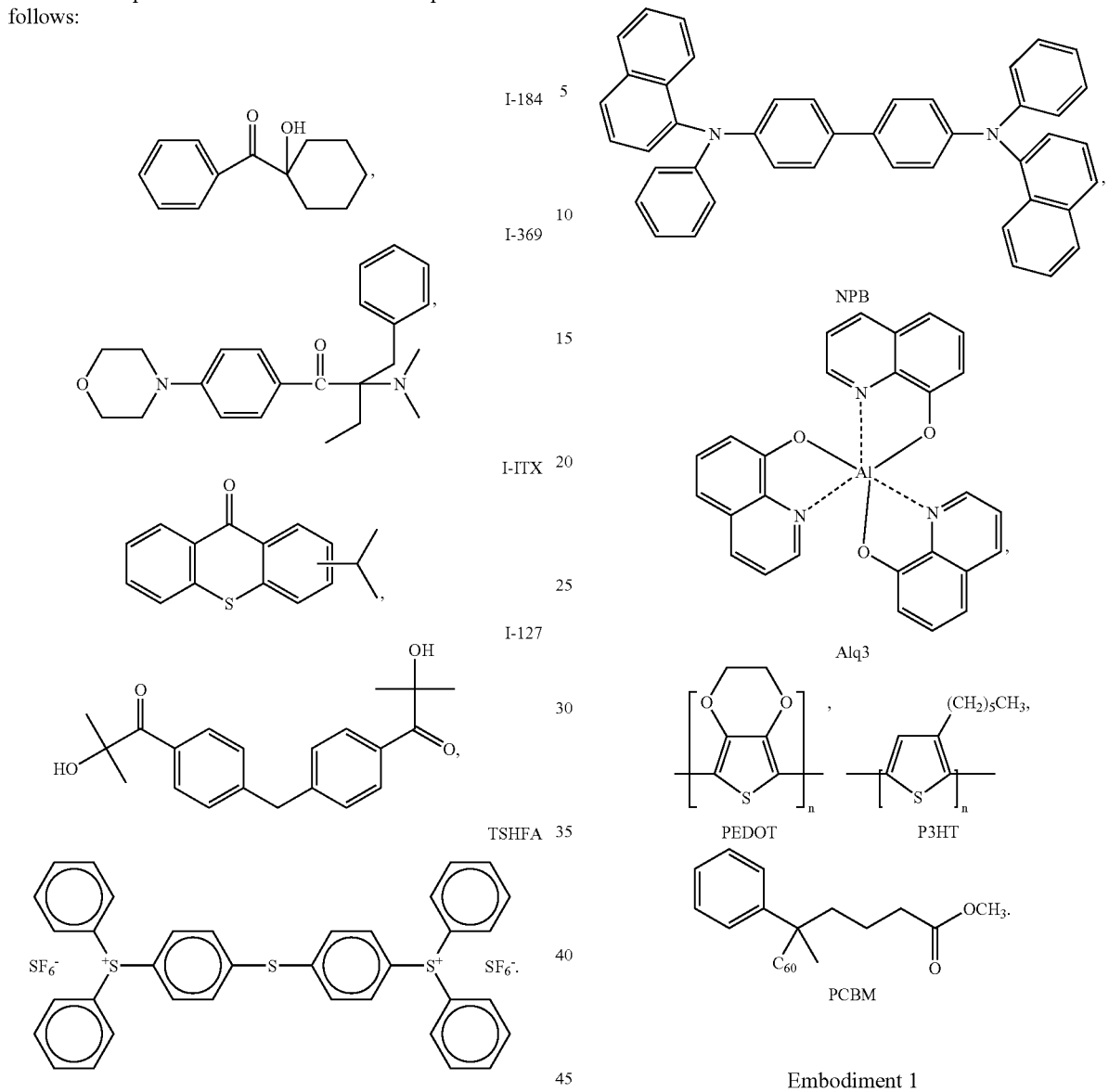

TABLE 3

Applied optical-electronic materials

| Optical-electronic materials | Source vendor | Descriptions/Remarks |
|---|---|---|
| NPB | Aldrich Co. | hole transport material |
| Alq3 | Aldrich Co. | light emitting material |
| PEDOT | Aldrich Co. | hole transport material |
| P3HT | Aldrich Co. | p-type semiconductor material |
| PCBM | Aldrich Co. | n-type semiconductor material |

The above optical-electronic materials have structures represented as follows:

Embodiment 1

117 g of benzyl methacrylate (BZMA), 86 g of methyl methacrylate (MAA), 130 g of 2-hydroxyl ethyl mathacrylate (2-HEMA), and 39 g of silicon oxide and 4 g of photoinitiator I-184 were mixed in a container. The above materials were then stirred by a mechanic agitator at a normal pressure and normal temperature such that an encapsulant composition was obtained. Next, an illumination process was performed to illuminate the obtained encapsulant composition by a deep ultraviolet (DUV) light source (about 100 W) for 20 minutes, thereby synthesizing the encapsulant composition to fabricate an acrylic copolymer I. The acrylic copolymer I was fabricated by synthesizing the encapsulant composition according to the following Formula (1):

Formula (1) is

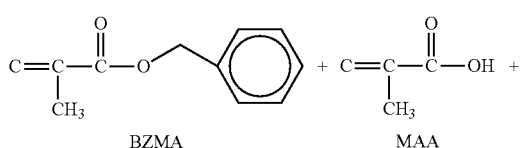

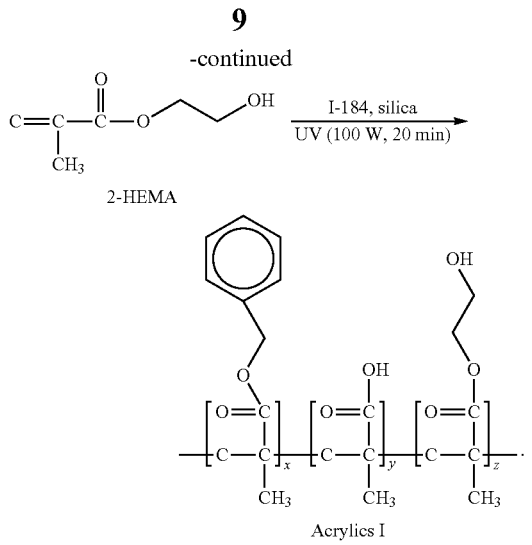

Acrylics I

Next, physical properties such as viscosity, molecular weight, adhesive strength, hardness, light transparency and reflective index of the acrylic copolymer I were tested and results thereof are shown in Tables 5 and 6. Tests done to the acrylic polymer I were described in Table 4, and measurements of adhesive strength, hardness, light transparency and reflective index were achieved by testing a sample of 5 square centimeters coated over a substrate such as a glass substrate by the measuring instruments and measuring method described in Table 4. The sample was previously cured by a DUV light illumination source for 3 minutes before tests were completed.

TABLE 4 measuring instruments and methods for physical properties

| Physical property | measuring instruments/measuring methods |
|---|---|
| viscosity | By Viscolite 700 (@ 25° C.) |
| molecular weight | Waters Alliance GPC V2000 (Reference: Polystyrene; @ 25° C.) |
| adhesive strength | By universal tester (obtained from Hung Ta Co.) (testing method: ASTM D1002) |
| Hardness | By pencil hardness tester ZSH 2090 (testing method: ASTM D-2240A) |
| Light transparency | HITACHI U-3300 (@ 25° C.) |
| Reflective index | By Filmetrics F20 (@ 25° C.) |

Embodiment 2

117 g of PU-Acrylics comonomer a, 39 g of silicon oxide, 2 g of photoinitiator I-184, and 4 g of photoinitiator I-369 were mixed in a container. The above materials were then stirred by a mechanic agitator at a normal pressure and normal temperature such that an encapsulant composition was obtained. Next, an illumination process was in-situ performed to illuminate the obtained encapsulant composition by a deep ultraviolet (DUV) light source (about 100 W) for 20 minutes, thereby synthesizing the encapsulant composition to fabricate a PU-Acrylics copolymer I. Herein, the PU-Acrylics copolymer I was fabricated by synthesizing the encapsulant composition according to the following Formula (2):

Formula (2) is

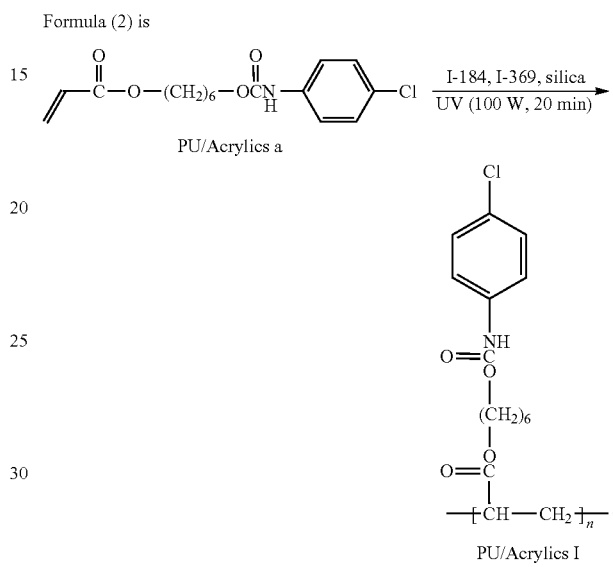

Physical properties of the PU-Acrylics copolymer I of Embodiment 2 were examined according similar methods as described in Embodiment 1 and results are shown in Tables 5 and 6.

Embodiment 3

117 g of PU-Acrylics comonomer b, 39 g of silicon oxide, 2 g of photoinitiator I-184, and 4 g of photoinitiator I-369 were mixed in a container. The above materials were then stirred by a mechanic agitator at a normal pressure and normal temperature such that an encapsulant composition was obtained. Next, an illumination process was in-situ performed to illuminate the obtained encapsulant composition by a deep ultraviolet (DUV) light source (about 100 W) for 20 minutes, thereby synthesizing the encapsulant composition to fabricate a PU-Acrylics copolymer II. Herein, the PU-Acrylics copolymer II was fabricated by synthesizing the encapsulant composition according to the following Formula (3):

Formula (3) is

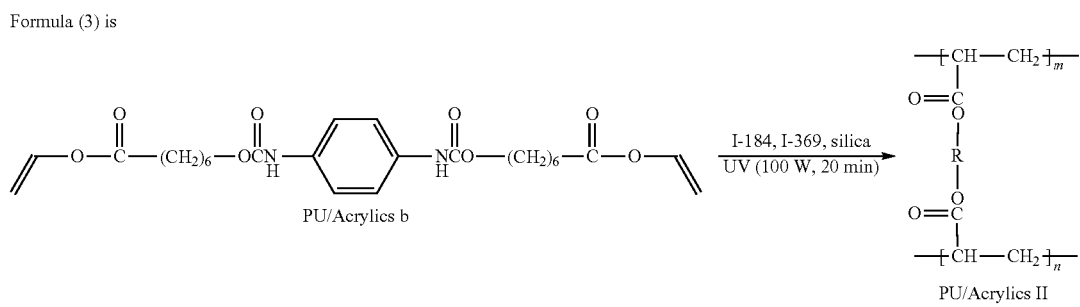

-continued

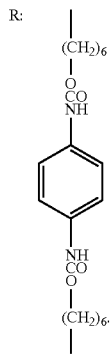

Physical properties of the PU-Acrylics copolymer II of Embodiment 3 were measured according similar methods as described in Example 1 and results are shown in Tables 5 and 6.

Embodiment 4

117 g of PU-Acrylics comonomer c, 39 g of silicon oxide, 2 g of photoinitiator I-184, and 4 g of photoinitiator I-369 were mixed in a container. The above materials were then stirred by a mechanic agitator at a normal pressure and normal temperature such that an encapsulant composition was obtained. Next, an illumination process was in-situ performed to illuminate the obtained encapsulant composition by a deep ultraviolet (DUV) light source (about 100 W) for 20 minutes, thereby synthesizing the encapsulant composition to fabricate a PU-Acrylics copolymer III. Herein, the PU-Acrylics copolymer III was fabricated by synthesizing the encapsulant composition according to the following Formula (4):

Formula (4) is

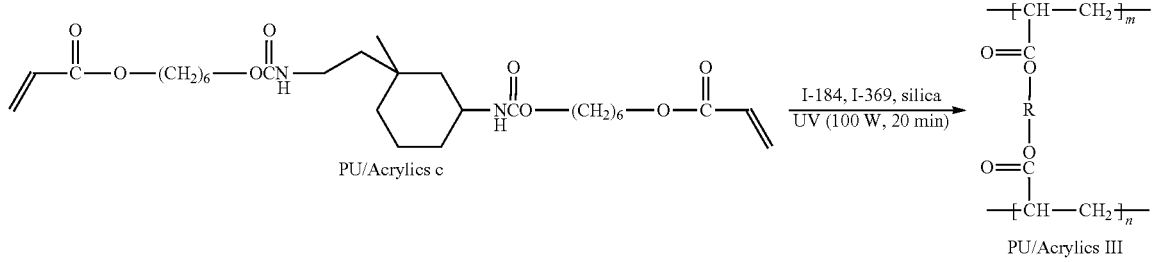

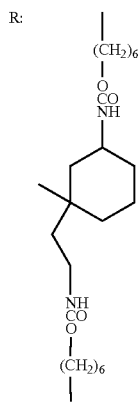

Physical properties of the PU-Acrylics copolymer III of Embodiment 4 were measured according similar methods as described in Embodiment 1 and measuring results are shown in Tables 5 and 6.

Embodiment 5

117 g of Silicone monomer a, 39 g of silicon oxide, 4 g of photoinitiator I-184, 2 g of photoinitiator I-369, and 2 g of photoinitiator I-ITX were mixed in a container. The above materials were then stirred by a mechanic agitator at a normal pressure and normal temperature such that an encapsulant composition was obtained. Next, an illumination process was in-situ performed to illuminate the obtained encapsulant composition by a deep ultraviolet (DUV) light source (about 100 W) for 20 minutes, thereby synthesizing the encapsulant composition to fabricate a Silicone-Acrylics copolymer I. Herein, the Silicone-Acrylics copolymer I was fabricated by synthesizing the encapsulant composition according to the following Formula (5):

Formula (5) is

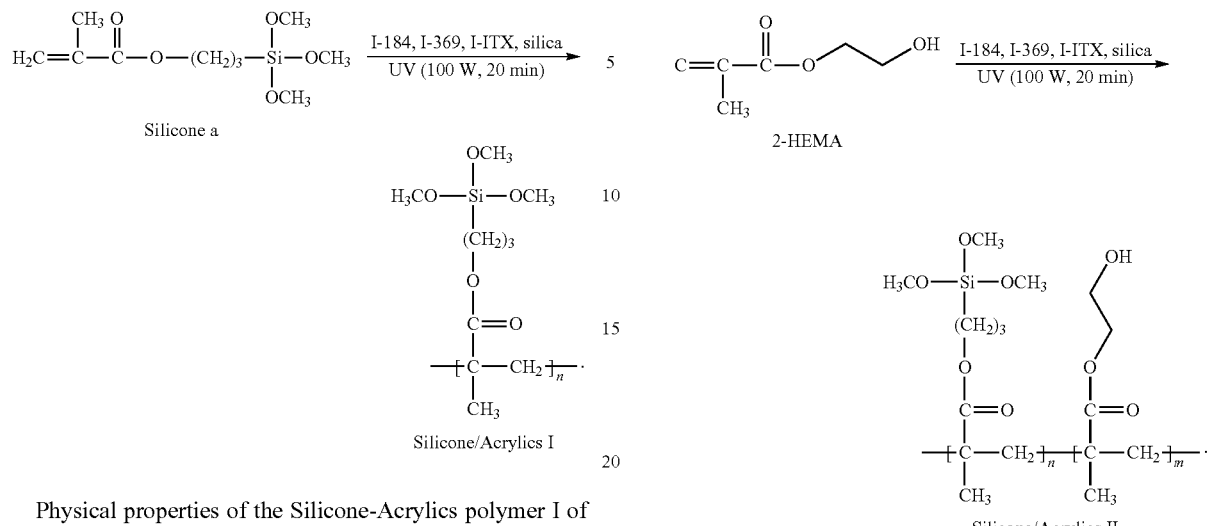

Silicone/Acrylics I

Physical properties of the Silicone-Acrylics polymer I of Embodiment 5 were measured according similar methods as described in Embodiment 1 and measuring results are shown in Tables 5 and 6.

Embodiment 6

117 g of Silicone monomer a, 117 g of 2-hydroxyl ethyl mathacrylate (2-HEMA), 39 g of silicon oxide, 4 g of photoinitiator I-184, 2 g of photoinitiator I-369, and 2 g of photoinitiator I-ITX were mixed in a container. The above materials were then stirred by a mechanic agitator at a normal pressure and normal temperature such that an encapsulant composition was obtained. Next, an illumination process was in-situ performed to illuminate the obtained encapsulant composition by a deep ultraviolet (DUV) light source (about 100 W) for 20 minutes, thereby synthesizing the encapsulant composition to fabricate a Silicone-Acrylics copolymer II. Herein, the Silicone-Acrylics copolymer II was obtained by synthesizing the encapsulant composition according to the following Formula (6):

Formula (6) is

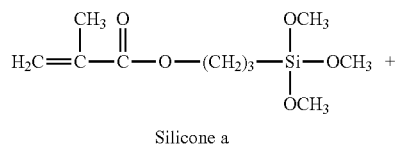

Silicone a

Physical properties of the Silicone-Acrylics copolymer II of Embodiment 6 were measured according similar methods as described in Embodiment 1 and measuring results are shown in Tables 5 and 6.

Embodiment 7

117 g of Silicone monomer a, 117 g of PU-acrylics comonomer b, 39 g of silicon oxide, 4 g of photoinitiator I-184, 2 g of photoinitiator I-369, 2 g of photoinitiator I-ITX and 1 g of photoinitiator I-127 were mixed in a container. The above materials were then stirred by a mechanic agitator at a normal pressure and normal temperature such that an encapsulant composition was obtained. Next, an illumination process was in-situ performed to illuminate the obtained encapsulant composition by a deep ultraviolet (DUV) light source (about 100 W) for 20 minutes, thereby synthesizing the encapsulant composition to fabricate a Silicone-Acrylics copolymer III. Herein, the Silicone-PU-Acrylics copolymer was fabricated by synthesizing the encapsulant composition according to the following Formula (7).

Formula (7) is

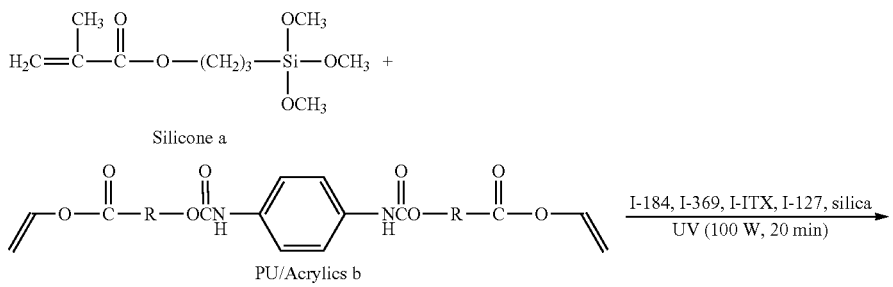

PU/Acrylics b

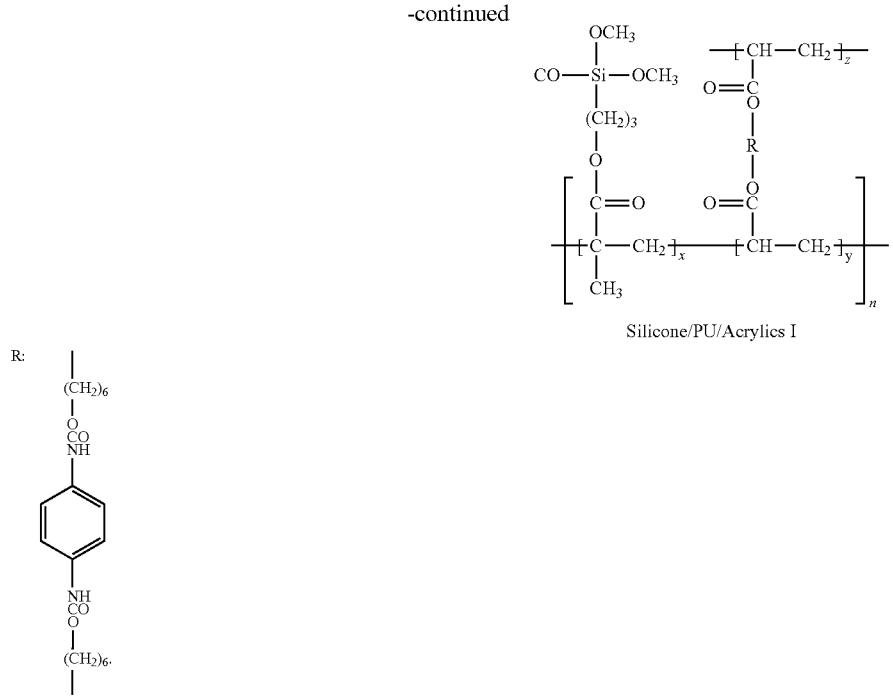

Silicone/PU/Acrylics I

Physical properties of the Silicone-PU-Acrylics copolymer of Embodiment 7 were measured according similar methods as described in Embodiment 1 and results are shown in Tables 5 and 6.

Embodiment 8

117 g of Epoxy monomer a, 10 g of silicon oxide, and 1 g of photoinitiator TSHFA were mixed in a container. The above materials were then stirred by a mechanic agitator at a normal pressure and normal temperature such that an encapsulant composition was obtained. Next, an illumination process was in-situ performed to illuminate the obtained encapsulant composition by a deep ultraviolet (DUV) light source (about 100 W) for 20 minutes, thereby synthesizing the encapsulant composition to fabricate an Epoxy polymer I. Herein, the Epoxy polymer I was fabricated by synthesizing the encapsulant composition according to the following Formula (8):

Physical properties of the Epoxy polymer I of Embodiment 8 were measured according similar methods as described in Embodiment 1 and results are shown in Tables 5 and 6.

Comparative Embodiment 1

117 g of benzyl methacrylate (BZMA), 86 g of methyl Methacrylate (MAA), 130 g of 2-hydroxyl ethyl mathacrylate (2-HEMA), 39 g of silicon dioxide, 4 g of benzophenone (BPO), as initiator, and 300 g of propylene glycol monomethyl ether acetate (PGMEA), as a solvent, were mixed in a container. The above material was then stirred by a mechanic agitator at a normal pressure and normal temperature and was then heated up to 90° C. and maintained at this temperature for 6 hours, synthesizing the encapsulant composition to fabricate an acrylic copolymer. Herein, the acrylic copolymer was obtained by synthesizing the encapsulant composition according to the following Formula (9):

Formula (8) is

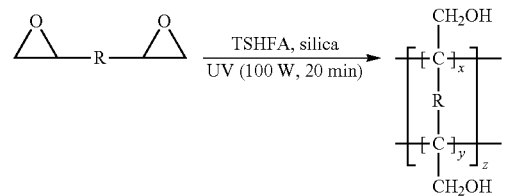

wherein,

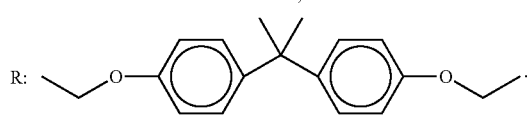

Formula (9) is

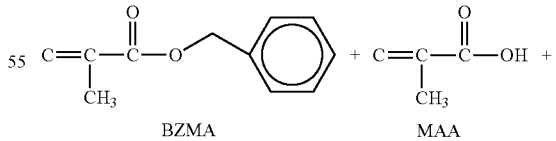

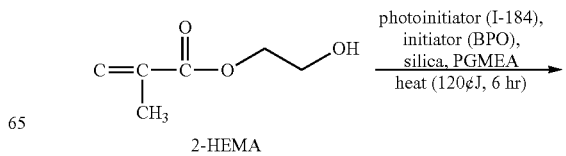

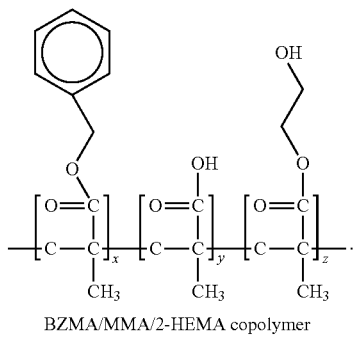

BZMA/MMA/2-HEMA copolymer

Physical properties of the acrylic polymer of comparative Embodiment 1 were measured according similar methods as described in Embodiment 1 and results are shown in Tables 5 and 6.

TABLE 5

Viscosity and molecular weight of encapsulant materials

| encapsulant materials | viscosity(cps) | Weight molecular (M$_w$) | number-average molecular weight (M$_n$) | M$_w$/M$_n$ |
|---|---|---|---|---|
| Acrylic polymer I | 15,100 | 233,100 | 113,300 | 2.06 |
| PU-Acrylic copolymer I | 8,600 | 123,100 | 66,100 | 1.86 |
| PU-Acrylic copolymer II | 23,200 | 275,000 | 138,400 | 1.99 |
| PU-Acrylic copolymer III | 22,800 | 262,000 | 125,400 | 2.09 |
| Silicone-acrylic copolymer I | 6,900 | 73,700 | 43,200 | 1.71 |
| Silicone-acrylic copolymer II | 8,800 | 103,100 | 56,700 | 1.82 |
| Silicone-PU-acrylic copolymer | 12,400 | 118,600 | 62,800 | 1.89 |
| Epoxy polymer | 10,700 | 93,200 | 48,600 | 1.92 |
| Acrylic copolymer of comparative example 1 | 8,100 | 112,300 | 55,800 | 2.01 |

TABLE 6 physical properties of encapsulant materials

| encapsulant materials | Adhesive strength (Kg/cm) | Hardness | Light transparency (%) | Reflective index (n) |
|---|---|---|---|---|
| Acrylic copolymer I | 0.3 | 2H | 90 | 1.38 |
| PU-Acrylic copolymer I | 0.8 | 2H | 87 | 1.45 |
| PU-Acrylic copolymer II | 1.4 | 3H | 90 | 1.46 |
| PU-Acrylic copolymer III | 1.3 | H | 91 | 1.41 |
| Silicone-acrylic copolymer I | 1.6 | 3B | 95 | 1.58 |
| Silicone-acrylic copolymer II | 1.7 | 2B | 93 | 1.51 |
| Silicone-PU-acrylic polymer | 2.1 | B | 92 | 1.56 |
| Epoxy copolymer | 1.5 | 3H | 88 | 1.48 |
| Acrylic copolymer of comparative example 1 | 0.1 | H | 90 | 1.38 |

Embodiment 9

A glass substrate (5Ω/□) 100 having an ITO layer 102 thereon was provided and immersed in a cleaning solution including acetone, methanol and DI water. The glass substrate 100 was cleaned by supersonic cleaning for 5 minutes and then treated by an O$_2$ plasma for 90 seconds. An electron transport layer 104 (including an NPB and having a thickness of about 50 nm), an light-emitting layer (including materials such Alq3, having a thickness of about 50 nm), a electron injecting layer (including LiF of a thickness of about 3 nm), and a cathode (including Al of a thickness of about 80 nm) 110 were sequentially formed over the ITO layer 102 by, for example, an evaporation method. Next, an encapsulant material such as the silicon-PU-acrylic copolymer obtained in Embodiment 7 was coated (coating condition: stage I 1500 rpm for 20 second, and stage II 3500 rpm for 30 seconds) over the cathode layer 110 and encapsulated sidewalls of the above stacked layers. The encapsulant material was then cured by illuminating thereof by ultraviolet light for 10 seconds and thereby formed a package layer 170 on the top and sidewall surfaces, resulting in packaging of an organic light emitting diode (OLED) device, as shown in FIG. 1. Herein, the OLED may emit light 180 such as green light toward a direction away from the glass substrate 100.

Embodiment 10

The fabrication steps in Embodiment 9 can be repeated and the glass substrate 100 can be replaced by a polyethylene terephthalate (PET) substrate 200, thereby resulting in packaging of a flexible OLED device. Herein, as shown in FIG. 2, components in the flexible OLED device are the same as the OLED device illustrated 100 besides the PET substrate 200. The components are referenced by the numerals illustrated in FIG. 1 plus 100 here. Moreover, as shown in FIG. 2, the flexible OLED device may emit light 280 such as green light toward a direction away from the PET substrate 200.

Embodiment 11

Figure 3:
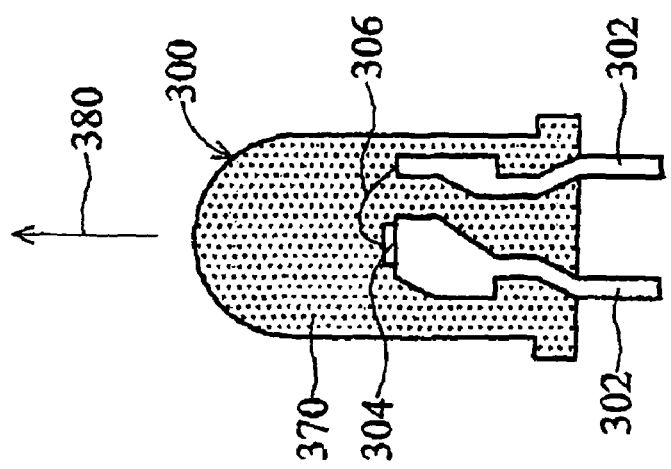
FIG. 3 is a schematic diagram showing a dome-shaped light emitting diode according to an embodiment of the invention.

Phosphors (produced by Nichia) were mixed with the silicon-PU-acrylic copolymer obtained in Embodiment 7 in a ratio of 16:84 by weight. The mixed material was then filled in a portion of a frame 302 with a blue ray chip 304 (produced by Tekcore Co., Taiwan, having a thickness of 460 nm and formed with a surface of 15 mil square), wherein the blue ray chip 304 was connected with another part of the frame 302 by wires 306. The above mixed material was then cured by illumination of UV light and the encapsulant material with blue ray chip 304 and Phosphors therein were displaced in a light-transmitting dome-shaped shell 300. Next, an encapsulating layer 370 of the silicon-PU-acrylic copolymer fully filled the interior of the dome-shaped shell 300 and was cured by UV light for 5 minutes, thereby forming a dome-shaped light emitting device, as shown in FIG. 3. In addition, the dome-shaped light emitting device may emit light 380 such as white light toward a direction away from the frame 302. Herein, the encapsulating layer 370 of silicon-PU-acrylic copolymer had a light transparency of more than 85% after curing thereof without hindering light emitting efficiency of the dome-shaped LED.

Embodiment 12

An ITO glass (5Ω/□) 400 was provided and immersed in a cleaning solution including acetone, methanol and DI water. The ITO glass 400 was cleaned by a supersonic cleaner for 5 minutes and then treated by an $O_2$ plasma for 90 seconds. An electron transport layer 404 (including PEDOT) and an active layer (including P3HT/PCBM of a weight ratio of 1:1), were sequentially formed over the ITO glass 400 by, for example, spin coating. Coating conditions thereof were stage I 1500 rpm for 20 second, and stage II 3500 rpm for 30 seconds for forming the hole transport layer 402 and stage I 1000 rpm for 20 second, and stage II 200 rpm for 30 seconds for forming the active layer 404. An electron injecting layer 406 (including LiF), and a cathode 408 (including Al) were sequentially formed over the active layer 404 by, for example, by an evaporation method. The silicon-PU-acrylic copolymer obtained in Embodiment 7 was then coated over the cathode 408 and encapsulate thereof (coating condition: stage I 1500 rpm for 20 second, and stage II 3500 rpm for 30 seconds). The encapsulant material was then cured by illuminating thereof by ultraviolet light for 10 seconds and thereby formed an encapsulant layer 470 on the top and sidewall surfaces, resulting in packaging of a solar cell device, as shown in FIG. 4. Herein, the solar cell may receive light 480 passing through the ITO glass 400.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating an encapsulant material, comprising:
providing an encapsulant composition comprising a silicone-PU-acrylic comonomer, a filler and a photoinitiator, wherein the silicone-PU-acrylic copolymer has a structure represented by a formula of:

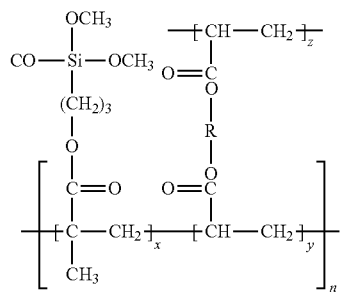

wherein R is represented by a formula of:

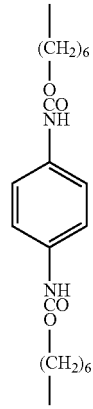

and the filler of about 0.1~15 weight % of the encapsulant composition; and
performing a first illumination process by a light source, illuminating the encapsulant composition and polymerizing thereof, thereby forming the encapsulant material.

2. The method as claimed in claim 1, further comprising performing a second illumination process by the light source for curing the encapsulant composition.

3. The method as claimed in claim 1, wherein the first illumination process is performed for about 1 to 200 minutes.

4. The method as claimed in claim 1, wherein the second illumination process is performed for about 1 to 200 minutes.

5. The method as claimed in claim 1, wherein the first illumination process is performed under a power of about 1 to 20000 watts.

6. The method as claimed in claim 4, wherein the second illumination process is performed under a power of about 1 to 20000 watts.

7. The method as claimed in claim 1, wherein the encapsulant composition has a viscosity of about 1 to 100000 cps.

8. The method as claimed in claim 1, wherein the encapsulant composition has a light transparency of more than 85% post polymerization.

9. The method as claimed in claim 1, wherein the filler comprises metal oxide, metal halides, or metal nitride.

10. The method as claimed in claim 1, wherein the photoinitiator comprises free radical initiators, cationic photoinitiators, or metallocenes.

11. The method as claimed in claim 8, wherein the filler is of about 5 to 15 weight % of the encapsulant composition.

12. The method as claimed in claim 1, wherein the encapsulant composition is capable of packaging a light emitting element.

13. The method as claimed in claim 12, wherein the light emitting element is an organic light emitting diode or a light emitting diode.

14. The method as claimed in claim 1, wherein the encapsulant composition is capable of packaging a solar cell device.

15. The method as claimed in claim 1, wherein the light source is an ultraviolet (UV) light source, a visible light source or an infrared (IR) light source.

* * * * *